United States Patent
Slobodnik et al.

(10) Patent No.: US 7,308,623 B2
(45) Date of Patent: Dec. 11, 2007

(54) INTEGRATED CIRCUIT AND METHOD FOR TESTING MEMORY ON THE INTEGRATED CIRCUIT

(75) Inventors: Richard Slobodnik, Austin, TX (US); Paul Stanley Hughes, Haverhill (GB); Frank David Frederick, Austin, TX (US); Brandon Michael Backlund, Austin, TX (US)

(73) Assignee: ARM Limited, Cambridge (GB)

( * ) Notice: Subject to any disclaimer, the term of this patent is extended or adjusted under 35 U.S.C. 154(b) by 328 days.

(21) Appl. No.: 11/076,020

(22) Filed: Mar. 10, 2005

(65) Prior Publication Data

US 2006/0212764 A1 Sep. 21, 2006

(51) Int. Cl.
*G11C 29/00* (2006.01)

(52) U.S. Cl. ..................................... 714/718
(58) Field of Classification Search ................ 714/718
See application file for complete search history.

(56) References Cited

U.S. PATENT DOCUMENTS

| | | | |
|---|---|---|---|
| 6,560,740 B1 * | 5/2003 | Zuraski et al. | 714/733 |
| 6,567,325 B1 * | 5/2003 | Hergott | 365/201 |
| 6,769,081 B1 * | 7/2004 | Parulkar | 714/733 |
| 2004/0006729 A1 * | 1/2004 | Pendurkar | 714/733 |

* cited by examiner

Primary Examiner—James C. Kerveros
(74) Attorney, Agent, or Firm—Nixon & Vanderhye P.C.

(57) ABSTRACT

An integrated circuit and method for testing memory on that integrated circuit includes processing logic operable to perform data processing operations on data, and a number of memory units operable to store data for access by the processing logic. A memory test controller is also provided for executing test events in order to seek to detect any memory defects in the number of memory units. The controller includes a storage operable to store event defining information for each of a plurality of test events forming a sequence of test events to be executed, and an interface which, during a single programming operation, receives the event defining information for each of the plurality of test events and causes that event defining information to be stored in the storage. Event processing logic within the controller is then operable, following the single programming operation, to execute the sequence of test events.

11 Claims, 4 Drawing Sheets

INTEGRATED CIRCUIT AND METHOD FOR TESTING MEMORY ON THE INTEGRATED CIRCUIT

BACKGROUND OF THE INVENTION

1. Field of the Invention

The present invention relates to an integrated circuit and method for testing memory on the integrated circuit.

2. Description of the Prior Art

It is becoming more and more common for integrated circuits to include embedded memory to allow rapid access to data by processing logic provided on the integrated circuit. As the use of embedded memory continues to increase, thorough testing and defect diagnosis has become a key requirement to ensure product quality and enhance product yield. Whilst embedded memory presents significant system performance and cost reduction advantages, it brings its own testing issues. Test vector style tests are not suitable for verifying embedded memory arrays for a number of reasons. Firstly, the time spent in the manufacturing test grows exponentially as the embedded memory die area increases, which often makes such test vector style testing too costly. Furthermore, it is sometimes not possible to create a set of vectors that can detect all possible types of memory defect.

A known technique which alleviates such problems is to provide the integrated circuit with a memory Built In Self-Test (BIST) controller. In simplistic terms, a memory BIST controller is an on-chip utility that enables the execution of a proven set of algorithmic style verification tests directly on the embedded memory. These tests can be executed at the design's full operating frequency to prove the memory operations and identify errors caused by silicon defects.

Typically, known memory BIST controller designs only allow the test algorithms to be programmed when the RTL (Register Transfer Language) for the integrated circuit is generated, and these test algorithms can then not be changed thereafter. However, such an approach has the disadvantage that the algorithms programmed at the RTL stage may later turn out not to include a needed algorithm, thereby requiring redesign, or may indeed include an algorithm that isn't actually required, thereby wasting test time. Accordingly, there is a need to provide more flexibility in algorithm selection, particularly in situations where the memory BIST controller is being designed without a knowledge of the final memory that will be placed within the integrated circuit.

To seek to provide such flexibility, ARM Limited of Cambridge, United Kingdom have developed a memory BIST controller that enables a test algorithm to be programmed after the integrated circuit has been produced in silicon. In particular, an interface is provided through which the desired test algorithm can be entered. However, such an approach requires a separate instruction load procedure to be performed for each test algorithm that is to be run by the memory BIST controller for the embedded memory devices. Since the interface will not typically be able to operate at the full operating speed of the integrated circuit, it is typically necessary to switch to a slower clock, execute a load instruction in order to load through the interface the required test algorithm, and then switch back to a fast clock, whereafter the memory BIST controller can execute the test algorithm in order to perform the test at the full operating frequency of the integrated circuit.

Whilst such an approach does provide some flexibility with regard to programming of test algorithms, it has been found that such an approach can significantly add to the time required to perform testing of the embedded memory, and also increases the complexity of the test procedure. In particular, such a load procedure needs to be performed for each different test algorithm to be programmed into the memory BIST controller after the integrated circuit silicon has been produced, and typically for each embedded memory that is to be subjected to execution of that test algorithm. Whilst it is possible to provide an interface large enough to enable multiple embedded memories to be tested in parallel this increases the complexity and expense of the BIST controller, and even then it is still necessary to perform the load procedure for each different test algorithm to be programmed into the memory BIST controller.

Accordingly, it would be desirable to provide an improved technique for allowing test algorithms to be programmed at run time, and in particular to develop a technique which reduced the time required for such testing and the complexity of the test process whilst retaining such flexibility.

SUMMARY OF THE INVENTION

Viewed from a first aspect, the present invention provides an integrated circuit, comprising: processing logic operable to perform data processing operations on data; a number of memory units operable to store data for access by the processing logic; and a memory test controller operable to execute test events in order to seek to detect any memory defects in the number of memory units; the memory test controller comprising: a storage operable to store event defining information for each of a plurality of test events forming a sequence of test events to be executed; an interface operable during a single programming operation to receive the event defining information for each of said plurality of test events and to cause that event defining information to be stored in the storage; and event processing logic operable, following said single programming operation, to execute said sequence of test events.

In accordance with the present invention, the memory test controller provided within the integrated circuit has a storage that can store event defining information for each of a plurality of test events forming a sequence of test events to be executed. Further, the memory test controller has an interface which, during a single programming operation, can receive event defining information for each of the plurality of test events, with that event defining information then being stored in the storage. Event processing logic within the memory test controller is then operable, following the single programming operation, to execute the sequence of test events.

Thus, in accordance with the present invention, a plurality of test events can be programmed into the memory test controller after the integrated circuit has been built, and that plurality of test events can be programmed via a single programming operation. Hence, in contrast to the prior art, it is no longer necessary to program and execute one test event at a time. Whilst the test events are still executed one at a time in a particular sequence, the programming of that sequence of test events can occur as part of a single programming operation.

This mechanism of the present invention is applicable to a number of programming operations of the memory test controller. For example, the sequence of test events may involve the performance of a particular test procedure on a particular sequence of memory units within the integrated circuit, the test procedure being executed on each memory unit in turn. In such instances, each piece of event defining information received during a single programming operation will identify a particular memory unit to which the test procedure is to be applied. This hence avoids the need to initiate a separate programming operation for each separate memory unit to which the test procedure is to be applied.

In an alternative embodiment, each test event is a test algorithm and the technique of the present invention is used to program a sequence of such test algorithms into the memory test controller. In that instance, each piece of event defining information defines a particular test algorithm. By such an approach, a single programming operation can be used to program in a sequence of test algorithms to be executed on a memory unit of the integrated circuit, and hence avoids the need for a separate programming operation to be performed after each test algorithm is executed, in order to load in the next test algorithm of the desired sequence.

In a further alternative embodiment, both of the above approaches are adopted, and accordingly through a single programming operation an entire sequence of test algorithms can be programmed into the test controller, and in addition a plurality of memory units can be identified upon which that test sequence is to be executed. The memory test controller will then be arranged, for each such identified memory unit in turn, to execute the entire sequence of test algorithms.

In one embodiment, said number of memory units comprises one or more memory units; each test event is a test algorithm to be executed for at least one of the number of memory units, and the event defining information is algorithm defining information; the interface is operable during the single programming operation to receive the algorithm defining information for each of the plurality of test algorithms in the sequence and to cause that algorithm defining information to be stored in the storage; and the event processing logic is operable, following said single programming operation, to execute the sequence of test algorithms for said at least one of the number of memory units. Hence, in this embodiment, as discussed earlier, a single programming operation is used to program into the memory test controller a plurality of test algorithms forming a sequence to be executed. Such an embodiment may be used in integrated circuits that only have a single memory unit to be tested, or in integrated circuits that have multiple memory units to be tested. In the latter case, the sequence of test algorithms may be executed on one or more of those memory units.

In one such embodiment, the storage comprises a set of n registers, each register being operable to store the algorithm defining information for one test algorithm, such that said sequence of test algorithms executed by the algorithm execution logic can comprise up to n test algorithms. Hence, in this embodiment, there is an upper limit on the number of test algorithms that can form a particular sequence of test algorithms to be executed on a memory unit, and in any particular programming operation the actual number of test algorithms programmed can be any number less than or equal to that maximum limit.

There are a number of ways in which a record of the number of test algorithms programmed into the memory test controller can be kept by the memory test controller, so that the memory test controller knows how many test algorithms need executing, and when all such test algorithms have completed execution. In one embodiment, each register has a valid field associated therewith that is set when algorithm defining information is stored in that register, such that the number of test algorithms in the sequence can be determined from the number of valid fields that are set. Hence, algorithm defining information can be stored in any of the registers of the register set, and the number of valid fields set directly indicates the number of test algorithms in the sequence.

It should be noted that in such embodiments not all of the available registers for the algorithm defining information need to be programmed if fewer than the maximum number of test algorithms are needed. This is due to the fact that the algorithm defining information in any particular register is ignored if the corresponding valid bit is not set during the programming operation. This saves test resources. In particular, in one embodiment the interface is a serial interface, and such an approach allows the serial shift process to be terminated when algorithm defining information defining the desired number of test algorithms has been shifted into the registers.

It is typically the case that the order in which the test algorithms are executed in the sequence is important, and accordingly the memory test controller should be provided with a mechanism for retaining that ordering information. In one embodiment, the memory test controller further comprises a valid field storage operable, prior to execution of the sequence of test algorithms, to store a copy of the valid fields of each of the set of registers, the valid field storage being used to control execution of the sequence of test algorithms by the event processing logic. The valid field storage can be arranged to hold the valid fields of the various registers in a predefined order that identifies the order in which the test algorithms must be executed in the sequence, and accordingly that valid field storage can be referenced to control execution of the sequence of test algorithms by the event processing logic. In one particular embodiment, each time execution of a particular test algorithm is completed by the event processing logic, the associated valid field is cleared in the valid field storage. Hence it can be seen that the valid field storage can then be referenced to identify the next valid field that is set, thereby identifying the register from which the next algorithm defining information should be retrieved.

The algorithm defining information can take a variety of forms. However, in one embodiment, the algorithm defining information comprises an algorithm selection encoding defining a particular type of test algorithm and a data seed defining the data to be used by the test algorithm. It will be appreciated that there are many different types of test algorithms that may usefully be executed with respect to the memory. Typically, such test algorithms involve writing data to the memory unit in accordance with a particular pattern and then reading that data back from the memory unit to ensure that there is correspondence between the data written and the data read. The data seed defines the actual data that is written in accordance with that pattern. Any discrepancy between the data written and the data read may indicate the presence of a memory defect in the associated memory unit.

In one embodiment, said number of memory units comprises a plurality of memory units; each test event is a test procedure performed on a memory unit of said plurality, and the event defining information identifies the memory unit on which the test procedure is to be performed; the interface is operable during the single programming operation to receive the event defining information for each of the plurality of test events and to cause that event defining information to be stored in the storage; and the event processing logic is operable, following said single programming operation, to execute said sequence of test events, whereby the test procedure is executed on one memory unit at a time until all memory units identified by the event defining information have been subjected to the test procedure.

Hence, in accordance with this embodiment, execution of the sequence of test events actually involves the execution of a particular test procedure on a sequence of memory units within the integrated circuit, with each piece of event defining information identifying one of the memory units to be tested in that sequence.

In accordance with one such embodiment, the storage has an entry associated with each of the plurality of memory units, with each entry being set in dependence on the event defining information, and when the event processing logic completes execution of the test procedure on a particular memory unit, the associated entry in the storage is cleared. Hence, following the programming operation, the storage will identify those memory units that are to be subjected to the test procedure, with the order in which those memory units are tested typically being predefined. Once execution of the test procedure on a particular memory unit is completed, the associated entry in the storage is cleared, and the next entry in the storage having a set value is identified in order to determine the next memory unit to be subjected to that test procedure.

In such embodiments, the test procedure may take a variety of forms. It may for example be a test algorithm programmed at RTL design stage, or could be a single test algorithm programmed at run time, i.e. after the integrated circuit has been built. Indeed in one particular embodiment the test procedure may comprise a plurality of test algorithms programmed into the memory test controller during a single programming operation as discussed earlier. More particularly, in such instances, the memory test controller further comprises: algorithm definition storage operable to store algorithm defining information for each of the plurality of test algorithms; the interface being further operable during the single programming operation to receive the algorithm defining information for each of the plurality of test algorithms and to cause that algorithm defining information to be stored in the algorithm definition storage; and the event processing logic being operable, following said single programming operation, to execute the plurality of test algorithms to implement the test procedure.

Hence, in such embodiments, through a single programming operation, a plurality of test algorithms can be programmed into the memory test controller, and in addition a plurality of memory units to which that plurality of test algorithms is to be applied can also be defined. For each identified memory unit in turn, the memory test controller will then execute the plurality of test algorithms on that memory unit in order to seek to detect any memory defects in that memory unit.

The integrated circuit can take a variety of forms. In one embodiment, the integrated circuit is a processor core. In another alternative embodiment, the integrated circuit may be a System-on-Chip (SoC).

Viewed from a second aspect, the present invention provides an integrated circuit, comprising: processing means for performing data processing operations on data; a number of memory means for storing data for access by the processing means; and memory test means for executing test events in order to seek to detect any memory defects in the number of memory means; the memory test means comprising: storage means for storing event defining information for each of a plurality of test events forming a sequence of test events to be executed; interface means for receiving, during a single programming operation, the event defining information for each of said plurality of test events and for causing that event defining information to be stored in the storage means; and event processing means for, following said single programming operation, executing said sequence of test events.

Viewed from a third aspect, the present invention provides a method of testing within an integrated circuit a number of memory units operable to store data for access by processing logic, the method comprising the steps of: during a single programming operation, receiving at an interface event defining information for each of a plurality of test events forming a sequence of test events to be executed; storing that event defining information in a storage; and following said single programming operation, executing within the integrated circuit said sequence of test events in order to seek to detect any memory defects in the number of memory units.

BRIEF DESCRIPTION OF THE DRAWINGS

The present invention will be described further, by way of example only, with reference to an embodiment thereof as illustrated in the accompanying drawings, in which.

DESCRIPTION OF AN EMBODIMENT

Figure 1:
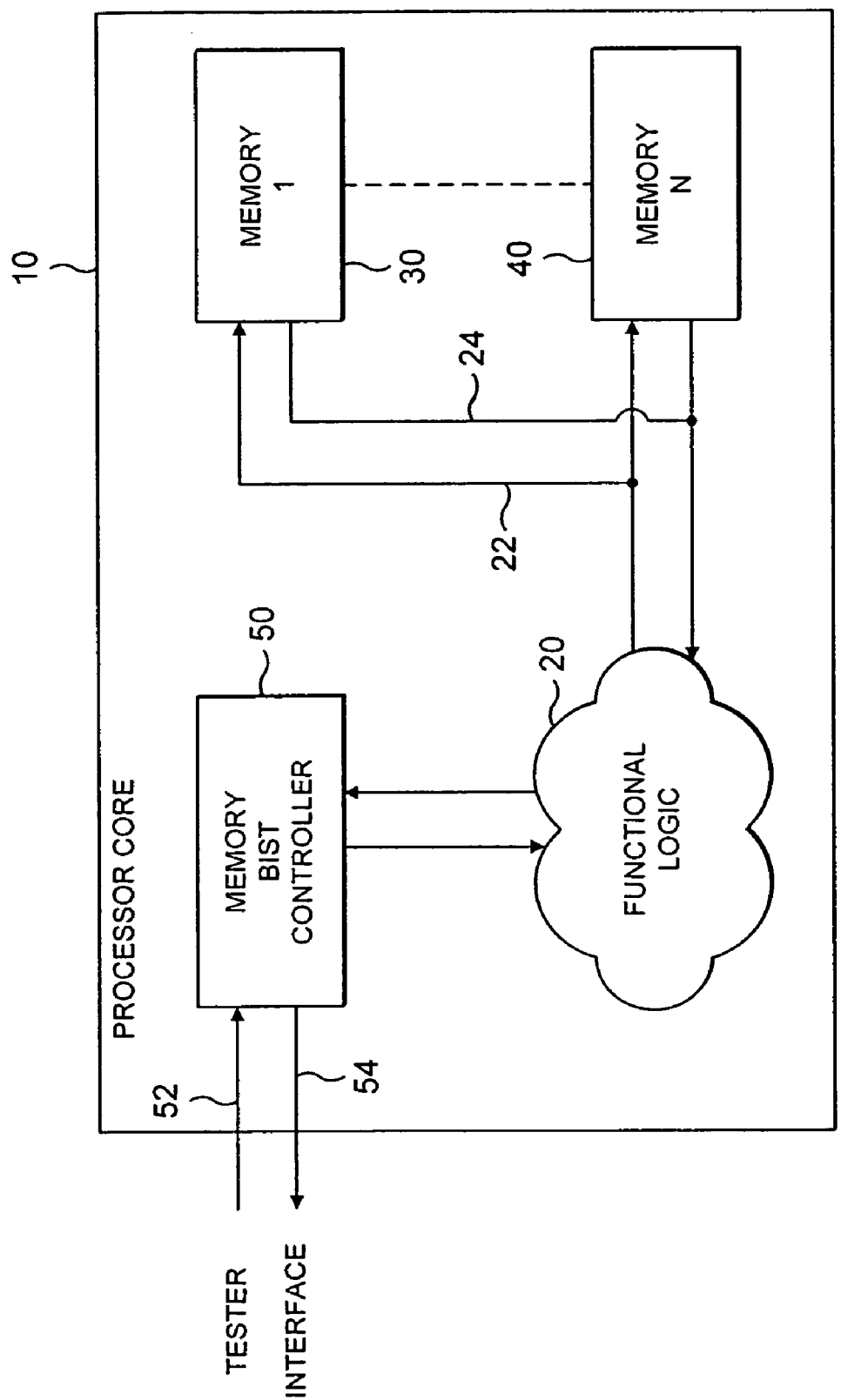
FIG. 1 is a block diagram of an integrated circuit in accordance with one embodiment of the present invention.

FIG. 1 is a block diagram of an integrated circuit in accordance with one embodiment of the present invention. In this particular example, the integrated circuit is a processor core. However, it will be appreciated that in other embodiments the integrated circuit may be of a different form, for example a System-on-Chip (SoC). The processor core 10 includes functional logic 20 which is coupled via a bus infrastructure 22, 24 with a number of memory devices 30, 40. The functional logic 20 will be arranged to perform a number of data processing operations, during which data will typically be written to one or more of the memory units 30, 40 and/or read from one or more of the memory units 30, 40.

The memory units 30, 40 may take a variety of forms, but in one embodiment may include caches and/or other types of embedded memory, for example Tightly Coupled Memory (TCM).

Also provided within the processor core 10 is a memory BIST controller 50 which is operable to execute test events in order to seek to detect any memory defects in any of the memory units 30, 40. When executing such test events, the memory BIST controller 50 typically causes the functional logic 20 to enter a test mode, during which the memory BIST controller can use the functional logic 20 to perform the required access operations with respect to the memory devices 30, 40 in order to perform the test procedures.

In accordance with embodiments of the present invention, the test events executed by the memory test controller are programmable via an interface, and in particular information defining the test events can be input from an external test system over path 52, and the results of execution of the test events can be output to that test system over path 54. In one embodiment of the present invention the interface to the external test system is a serial interface.

Figure 2:
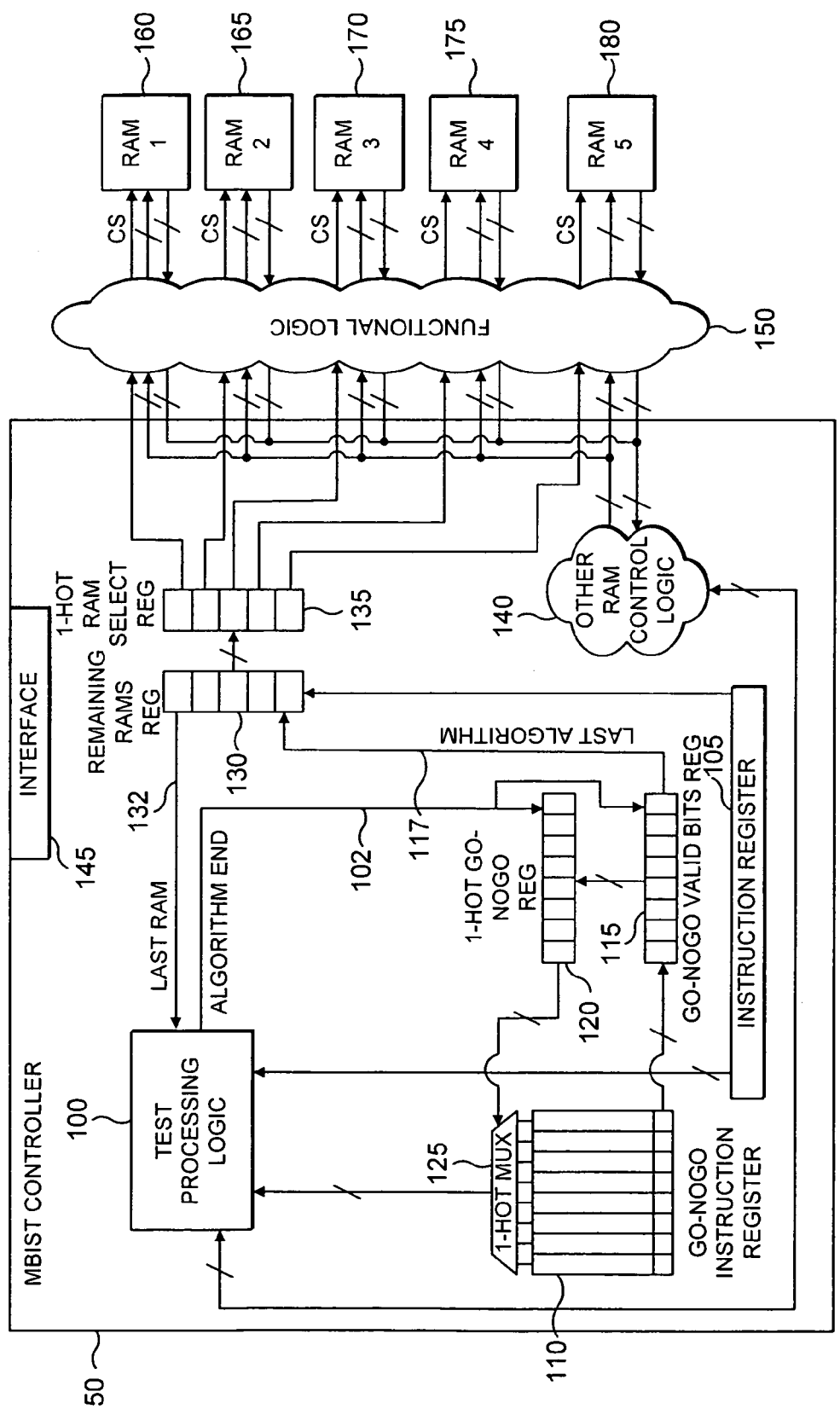
FIG. 2 is a block diagram illustrating in more detail the elements provided within the memory BIST controller of FIG. 1.

FIG. 2 is a block diagram illustrating in more detail the construction of the memory BIST controller 50 in accordance with one embodiment of the present invention. As shown in FIG. 2, in this example the functional logic 150 (which is equivalent of the functional logic 20 of FIG. 1) is coupled to five random access memory (RAM) units 160, 165, 170, 175, 180 which can be used to store data for access by the functional logic 150 during normal operation of the processor core 10. When in test mode, the functional logic 150 is used by the memory BIST controller 50 to access particular memory units in order to perform tests on those memory units with the aim of detecting any memory defects.

The memory BIST controller 50 includes test processing logic 100 which is used to execute a sequence of test events. As used herein, the term "test event" may refer to an individual test algorithm forming part of a sequence of test algorithms stored within the go-nogo instruction register set 110, or alternatively may be used to refer generally to a test procedure applied to a particular memory unit as defined in the remaining RAMs register 130.

The instruction register 105 is programmable to identify the type of test procedure to be applied by the test processing logic 100. In one embodiment, one such test procedure is the go-nogo test procedure in which a sequence of test algorithms are executed, the sequence being defined in the go-nogo instruction register set 110.

Figure 3:
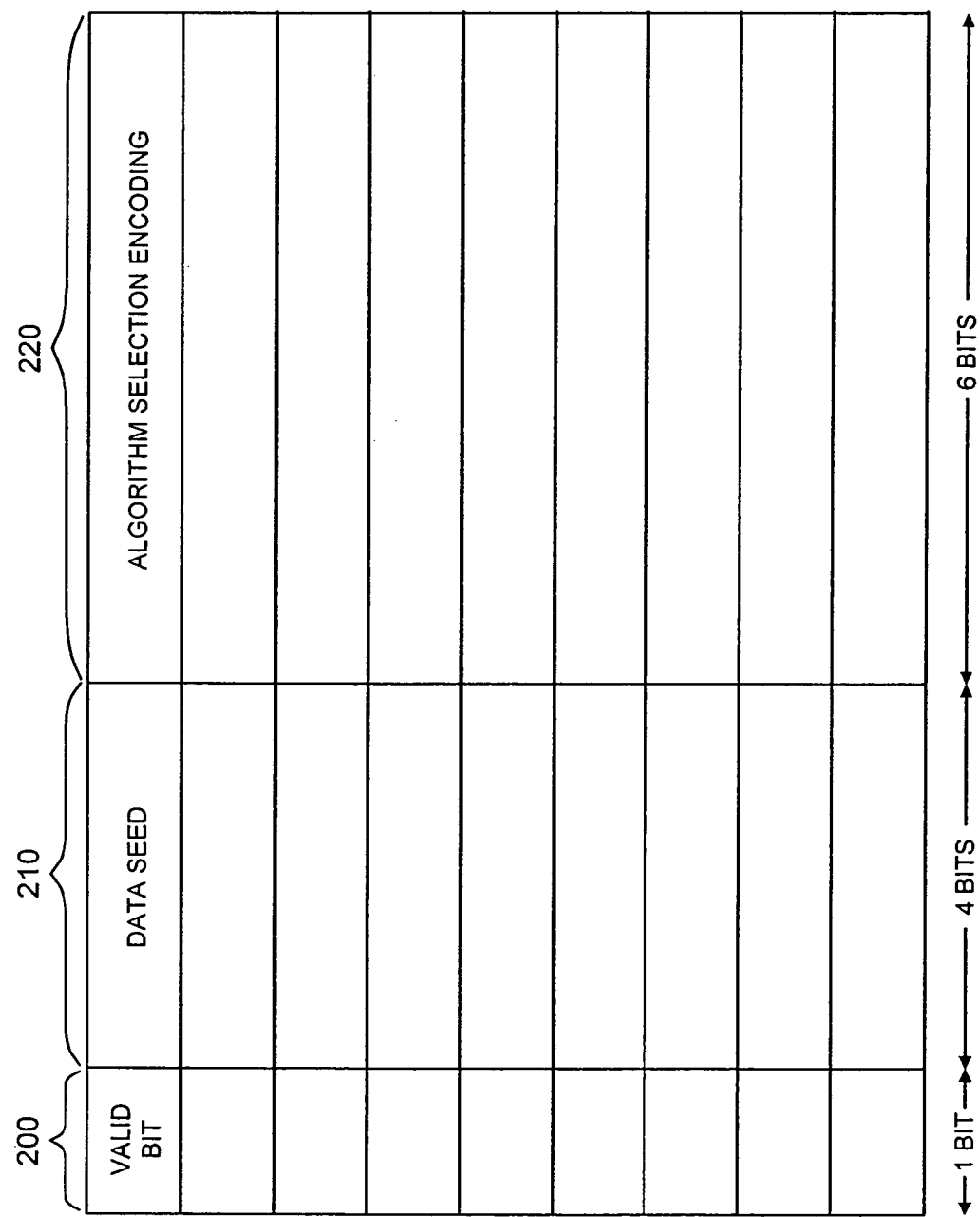
FIG. 3 is a diagram illustrating the fields provided within each register of the go-nogo instruction register set of FIG. 2 in accordance with one embodiment of the present invention.

The format of the go-nogo instruction register set 110 is illustrated in FIG. 3. As shown in FIG. 3, the go-nogo instruction register set 110 includes a number of registers, each of which contains three fields. A first field 200 contains a valid bit, which is set when algorithm defining information is stored within that register. The algorithm defining information contains a data seed programmed into field 210, the data seed defining the data to be used by the test algorithm, and an algorithm selection encoding programmed into the field 220, the algorithm selection encoding defining a particular type of test algorithm. It will be appreciated that there are a number of different types of test algorithm that may be executed on a memory unit in order to seek to detect any memory defects. Typically, the algorithm selection encoding specifies a particular pattern in which data is written to the memory unit, whilst the data seed identifies the form of the data to be written in accordance with that pattern. As a particular example, the algorithm selection encoding may specify a chequer board pattern and the data seed may specify a data value comprising all ones. In such instances, the test processing logic will be arranged to write a block of logic one values, followed by a block of logic zero values, followed by a block of logic one values, etc through the entirety of the memory unit to which the test process is being applied, and then will subsequently read that data back out from the memory in order to check whether it corresponds with the data written. If not, then a log of that error can be created and output over path 54 back to the external test system for analysis.

In accordance with an embodiment of the present invention, if the go-nogo testing procedure is to be applied, a particular bit pattern is stored into the instruction register 105 to identify the go-nogo testing procedure, and then, during the same programming operation, the algorithm defining information required to define all of the test algorithms in the associated test sequence are stored into the registers of the go-nogo instruction register set 110, with each register written to having its valid bit set. It should be noted that not all of the available registers in the go-nogo instruction register set need to be written to during this programming process, since the valid bits will by default be clear, and hence the contents of any registers with a clear valid bit will not be referenced during the subsequent go-nogo test procedure. This is a particular benefit when using the serial interface of one embodiment of the present invention, because it allows the serial shift process used to populate the registers of the go-nogo instruction register set 110 to be terminated when the algorithm defining information for the desired number of test algorithms has been shifted into that register set.

In one embodiment, if the go-nogo test pattern is written into the instruction register 105, but no algorithm defining information is stored into the go-nogo instruction register set 110, then a default go-nogo sequence of test algorithms is run by the test processing logic 100. Otherwise, the test algorithm sequence as stored in the go-nogo instruction register set 110 is executed. In one embodiment, the go-nogo instruction register set 110 includes eight registers, and accordingly up to eight test algorithms can be defined in the sequence.

Also during the programming process, a field in the instruction register 105 is set to identify which of the RAM units 160, 165, 170, 175, 180 are to be subjected to the test procedure, and this information is copied from the instruction register 105 into the remaining RAMs register 130.

Once the programming procedure has been completed, then the test process is initiated on the test processing logic 100. During this process, one of the bits in the one-hot RAM select register 135 is set to identify the first RAM unit to be tested. In particular, in one embodiment of the present invention, the default ordering is to perform the testing on each RAM unit in turn starting with RAM unit 1 and proceeding through RAM units 2, 3, 4 and 5. However, not all of the associated bits in the remaining RAMs register 130 will necessarily have been set. For example, the instruction register may have been programmed such that the test procedure is only applied to RAMs 1, 3 and 4. In this case, bits 1, 3 and 4 in the remaining RAMs register 130 will have been set, but bits 2 and 5 will be clear. Initially, this will cause the first bit in the one-hot RAM select register 135 to be set, which will cause a chip select signal to be routed through the functional logic 150 to RAM unit 1 160. Meanwhile, all other bits of the one-hot RAM select register 135 will be set to a logic zero value, which will disable the chip select signal output from the functional logic 150 to the other RAM units 165, 170, 175, 180.

The test process is then applied to the RAM unit 1 160 and on completion of that test procedure, the associated bit in the remaining RAMs register 130 is cleared. At this point, the one-hot RAM select register 135 is changed so that only bit 3 is set, this corresponding to the first non-clear bit now in the remaining RAMs register 130. By this approach, it can be seen that the test procedure is applied to each identified RAM unit in turn, and once the test procedure has been applied to all desired RAM units, then a signal is returned from the remaining RAMs register 130 to the test processing logic 100 over path 132 to confirm that the test has finished.

As mentioned earlier, in accordance with one embodiment of the present invention, the test procedure is the go-nogo test, whereby a sequence of test algorithms as defined in the go-nogo instruction register set 110 is executed. At the start of the test procedure, a copy of the valid bits of each of the go-nogo instruction register set 110 is sent to the go-nogo valid bits register 115. The first bit in the go-nogo valid bits register 115 that is set, starting from the left hand side as shown in FIG. 2, then causes the corresponding bit to be set in the one-hot go-nogo register 120, which is then used to drive the one-hot multiplexer 125 to output the associated algorithm defining information to the test processing logic 100. Hence, as an example, if the first bit in the go-nogo valid bits register 115 is set, this will cause the first bit in the one-hot go-nogo register 120 to be set and all other bits to remain cleared. This will then cause the one-hot multiplexer 125 to output the algorithm defining information from the first register in the go-nogo instruction register set 110.

As discussed earlier, this will cause the test processing logic 100 to write data to the selected RAM unit 160, 165, 170, 175, 180 in a pattern defined by the algorithm defining information from the relevant register of the go-nogo instruction register set 110, and subsequently to read that data back in order to check that there is correspondence. This writing and reading process is performed by the other RAM control logic 140 which interfaces with the functional logic 150 of the processor core to cause the required data to be written to, and read from, the RAM unit whose chip select signal is currently enabled.

When a particular test algorithm ends, a control signal is routed over path 102 to both the one-hot go-nogo register 120 and the go-nogo valid bits register 115. This causes the first set bit in the go-nogo valid bits register to be cleared, since the test algorithm associated with that set bit has now been performed, and the one-hot go-nogo register 120 is then set in dependence on the first non-cleared bit that is now present in the go-nogo valid bits register 115. It can hence be seen that this will cause the next test algorithm in the sequence to be executed by the test processing logic 100.

Once all of the test algorithms in the test sequence have been executed, this will be indicated by the go-nogo valid bits register 115 receiving an algorithm end signal over path 102 when only one bit remains set in the go-nogo valid bits register 115. This will cause a last algorithm signal to be issued over path 117 to the remaining RAMs register 130, which will cause the first non-cleared bit of the remaining RAMs register 130 to then be cleared. This will cause the one-hot RAM select register 135 to be updated so as to issue a valid chip select signal to the next RAM unit to be tested.

When all the RAMs have been subjected to the test procedure, a last RAM signal is issued over path 132 to the test processing logic 100 to terminate the test procedure.

Figure 4:
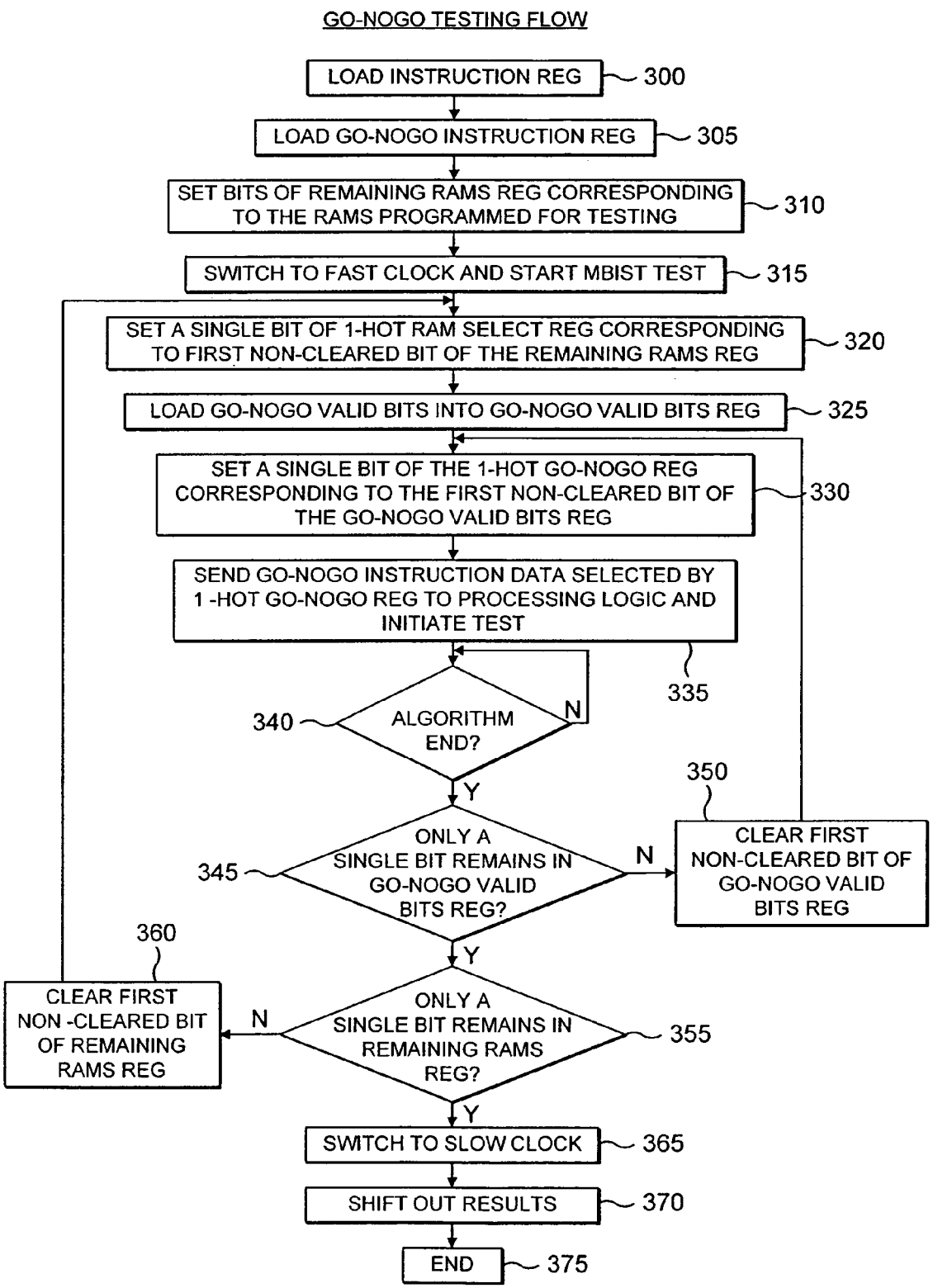
FIG. 4 is a flow diagram illustrating the sequence of steps performed in order to implement a go-nogo testing process in accordance with one embodiment of the present invention.

FIG. 4 is a flow diagram illustrating in more detail the sequence of flow performed by the memory BIST controller 50 of FIG. 2 when performing a go-nogo testing procedure. At step 300, the instruction register 105 is loaded with a pattern indicating that the go-nogo test procedure is to be implemented. Thereafter, at step 305, the go-nogo instruction register set 110 is loaded with the required algorithm defining information.

Then at step 310, the bits in the remaining RAMs register 130 are set to identify the RAMs that are to be programmed for testing, this information being routed to the remaining RAMs register 130 from the instruction register 105.

During steps 300, 305 and 310, the processor core is operating at a slow clock frequency appropriate to allow the required data to be shifted in through the serial interface. At step 315, the clock frequency is switched to the normal fast clock frequency of the integrated circuit and the BIST test procedure is started.

At step 320, a single bit of the one-hot RAM select register 135 is set corresponding to the first non-cleared bit of the remaining RAMs register 130. Then, at step 325, the go-nogo valid bits are loaded from the go-nogo instruction register set 110 into the go-nogo valid bits register 115.

At step 330, a single bit of the one-hot go-nogo register 120 corresponding to the first non-cleared bit of the go-nogo valid bits register 115 is set, which at step 335 then causes the one-hot multiplexer 125 to output the contents of the appropriate go-nogo instruction register to the test processing logic 100 in order to cause the corresponding test algorithm to be executed.

At step 340, it is determined whether that test algorithm has completed, and when the algorithm has completed, the process proceeds to step 345, where it is determined whether there is only a single bit remaining in the go-nogo valid bits register 115. If not, then the process branches to step 350, where the first non-cleared bit of the go-nogo valid bits register is cleared, whereafter the process returns to step 330.

Steps 330, 335, 340, 345 and 350 are then repeated iteratively until each test algorithm of the sequence has been completed. At that time, it will be determined at step 345 that there is only a single bit remaining in the go-nogo valid bits register 115, and at this point the process then branches to step 355, where it is determined whether there is only a single bit remaining in the remaining. RAMs register 130.

If not, the process then branches to step 360, where the first non-cleared bit of the remaining RAMs register 130 is cleared, whereafter the process returns to step 320. This then causes the entire sequence of test algorithms to be repeated for the next RAM unit to be tested.

This process is repeated until at step 355 it is determined that there is only a single bit remaining in the remaining RAMs register 130, this indicating that all desired RAM units have been subjected to the test procedure. At this point, the process proceeds to step 365, where the integrated circuit is caused to switch to the slow clock frequency, after which the results of the test procedure are shifted out of the serial interface at step 370, the process then ending at step 375.

From the above description, it will be appreciated that the above described embodiment of the present invention provides a particularly efficient technique for allowing a sequence of test algorithms to be programmed via a single programming operation at run time. That single programming operation can also be used to define which of a plurality of memory units on the integrated circuit are to be tested. The memory BIST controller can then execute that sequence of test algorithms on each desired memory unit in turn at the standard operating frequency of the integrated circuit in order to seek to identify any memory defects in any of the memory units. The results of that test can then be output to an external test system for analysis.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. An integrated circuit, comprising:
   processing logic operable to perform data processing operations on data;
   at least one memory unit operable to store data for access by the processing logic; and
   a memory test controller operable to execute test algorithms in order to seek to detect any memory defects in said at least one memory unit; the memory test controller comprising:

a storage for storing algorithm defining information for each of a plurality of test algorithms forming a sequence of test algorithms to be executed as a test procedure for at least one of said at least one memory unit;
an interface operable during a single programming operation to receive the algorithm defining information for each of said plurality of test algorithms in the sequence and to cause said algorithm defining information to be stored in the storage; and
algorithm processing logic operable, following said single programming operation, to execute said sequence of test algorithms for said at least one of said at least one memory unit.

2. An integrated circuit as claimed in claim 1, wherein the storage comprises a set of n registers, each register being operable to store the algorithm defining information for one test algorithm, such that said sequence of test algorithms executed by the algorithm processing logic can comprise up to n test algorithms.

3. An integrated circuit as claimed in claim 2, wherein each register has a valid field associated therewith that is set when algorithm defining information is stored in that register, such that the number of test algorithms in the sequence can be determined from the number of valid fields that are set.

4. An integrated circuit as claimed in claim 3, wherein the memory test controller further comprises a valid field storage operable, prior to execution of the sequence of test algorithms, to store a copy of the valid fields of each of the set of registers, the valid field storage being used to control execution of the sequence of test algorithms by the event processing logic.

5. An integrated circuit as claimed in claim 4, wherein each time execution of a particular test algorithm is completed by the algorithm processing logic, the associated valid field is cleared in the valid field storage.

6. An integrated circuit as claimed in claim 1, wherein the algorithm defining information comprises an algorithm selection encoding defining a particular type of test algorithm and a data seed defining the data to be used by the test algorithm.

7. An integrated circuit as claimed in claim 1, wherein:
said at least one memory unit comprises a plurality of memory units;
the interface is operable during the single programming operation to receive memory defining information identifying each memory unit in said plurality on which the test procedure is to be performed, and to cause that memory defining information to be stored in further storage; and
the algorithm processing logic is operable, following said single programming operation, to execute said test procedure on one memory unit at a time until all memory units identified by the memory defining information have been subjected to the test procedure.

8. An integrated circuit as claimed in claim 7, wherein the further storage has an entry associated with each of the plurality of memory units, with each entry being set in dependence on the memory defining information, and when the algorithm processing logic completes execution of the test procedure on a particular memory unit, the associated entry in the storage is cleared.

9. An integrated circuit as claimed in claim 1, wherein the integrated circuit is a processor core.

10. An integrated circuit, comprising:
processing means for performing data processing operations on data; at least one memory means for storing data for access by the processing means; and
memory test means for executing test algorithms in order to seek to detect any memory defects in the at least one memory means; the memory test means comprising:
storage means for storing algorithm defining information for each of a plurality of test algorithms forming a sequence of test algorithms to be executed as a test procedure for at least one of said at least one memory means;
interface means for receiving, during a single programming operation, the algorithm defining information for each of said plurality of test algorithms in the sequence and for causing that algorithm defining information to be stored in the storage means; and
algorithm processing means for, following said single programming operation, executing said sequence of test algorithms for said at least one of said at least one memory means.

11. A method of testing within an integrated circuit at least one memory unit operable to store data for access by processing logic, the method comprising the steps of:
during a single programming operation, receiving at an interface algorithm defining information for each of a plurality of test algorithms forming a sequence of test algorithms to be executed as a test procedure for at least one of said at least one memory unit;
storing that algorithm defining information in a storage; and
following said single programming operation, executing within the integrated circuit said sequence of test algorithms for said at least one of said at least one memory unit in order to seek to detect any memory defects in the at least one of said at least one memory units.

* * * * *